United States Patent [19]
Takebuchi

[11] Patent Number: 5,138,410
[45] Date of Patent: Aug. 11, 1992

[54] NONVOLATILE SEMICONDUCTOR MEMORY DEVICE HAVING TUNNEL INSULATING FILM STRUCTURE

[75] Inventor: Masataka Takebuchi, Yokohama, Japan

[73] Assignee: Kabushiki Kaisha Toshiba, Kawasaki, Japan

[21] Appl. No.: 623,064

[22] Filed: Dec. 6, 1990

[30] Foreign Application Priority Data

Dec. 11, 1989 [JP] Japan .................. 1-318976

[51] Int. Cl.⁵ .................. H01L 29/68; H01L 29/34; H01L 27/02
[52] U.S. Cl. .................. 357/23.5; 357/54; 357/41
[58] Field of Search .......... 357/23.5, 54 AN

[56] References Cited

FOREIGN PATENT DOCUMENTS 61-147576 7/1986 Japan .................. 357/23.5
62-266872 11/1987 Japan .................. 357/23.5

OTHER PUBLICATIONS

Naruke et al., "Stress Induced Leakage Current Limiting to Scale Down Eeprom Tunnel Oxide Thickness", Tech Dig. IEEE, 424 IEDM 1988.
Arnett, P. C. and B. H. Yun, "Silicon Nitride Trap Properties as Revealed by Charge-Centroid Measurements on MNOS Devices", Appl. Phys. Lett., vol. 26, No. 3, pp. 94-96, Feb. 1, 1975.
Suzuki, "A Study on Researches of the Electro-Technical Laboratory" No. 844, May 1984, pp. 110-111.
Chen et al., "Oxide Breakdown Dependence on Thickness and Hole Current-Enhanced Reliability of Ultra Thin Oxides" IEDM 1986, pp. 660-663.
Hughes, R. C. and C. H. Seager, "Hole Trapping, Recombination and Space Charge in Irradiated Sandia Oxides", IEEE TRANS. on Nucleas Science vol. NS-30, No. 6, Dec. 1983.
Maes H. E. and R. J. Van Overstraeten, "Memeory Loss in MNOS Capacitors", J. Appl. Phys. vol. 47, p. 667, 1967.

*Primary Examiner*—William D. Larkins
*Assistant Examiner*—Robert Limanek
*Attorney, Agent, or Firm*—Finnegan, Henderson, Farabow, Garrett and Dunner

[57] ABSTRACT

For improving endurance and retention characteristics of a nonvolatile semiconductor memory device that comprises a semiconductor substrate having source and drain regions therein, a floating gate provided above the semiconductor substrate through a first gate insulating film, a control gate provided above the flosting gate through a second gate insulating film, and a tunnel region provided in the first gate insulating film, an aperture is provided in the first gate insulating film so as to reach the semiconductor substrate, thereby defining the tunnel region therewith, and a tunnel insulating layer including at least one silicon nitride film is provided within the aperture.

7 Claims, 6 Drawing Sheets

NONVOLATILE SEMICONDUCTOR MEMORY DEVICE HAVING TUNNEL INSULATING FILM STRUCTURE

BACKGROUND OF THE INVENTION

1. Field of the Invention

The present invention relates to a nonvolatile semiconductor memory device, and more particularly to an EEPROM capable of erasing electrical data.

2. Description of the Related Art

A conventional EEPROM is nonvolatile semiconductor memory device capable of erasing/writing electrical data.

Conventional EEPROMs include a tunnel region for electrically removing charges which represent storage information stored in a floating gate. In the latest EEPROM, a thin single-layer silicon oxide film is formed at the tunnel region. Charges, i.e., electrons, tunnel through the thin single-layer silicon oxide film and are transferred to a high potential region. For example, when a high voltage is applied to a drain region, electrons stored in a gate electrode tunnel through the single-layer silicon oxide film and are transferred to the drain region.

The most important reliability factor of conventional EEPROMS is an endurance characteristic of the tunnel insulating film i.e., a (repetition characteristic for erasing/writing data, which corresponds to repetitive operations for injecting electrons into a floating gate and removing the electrons from the floating gate).

The endurance characteristic depends on the quality of the tunnel insulating film. As described above, in conventional EEPROMs the single-layer silicon oxide film is used as the tunnel insulating film. At the present, the limit of the endurance characteristic is $10^4$ to $10^5$ repetitions in 64-Kbit EEPROMs.

SUMMARY OF THE INVENTION

It is, therefore, an object of the present invention to provide a nonvolatile semiconductor memory device having an improved tunnel insulating film structure.

It is another object of the present invention to provide a nonvolatile semiconductor memory device including a tunnel insulating film having an improved endurance characteristic.

According to an aspect of the present invention, there is provided a nonvolatile semiconductor memory device with improved endurance and retention characteristics which comprises a semiconductor substrate having source and drain regions therein, a floating gate provided above the semiconductor substrate through a first gate insulating film, a control gate provided above the floating gate through a second gate insulating film, and a tunnel region provided in the first gate insulating film. An aperture is provided in the first gate insulating film so as to reach the semiconductor substrate, thereby defining the tunnel region therewith, and a tunnel insulating layer including at least one silicon nitride film is provided within the aperture.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Semiconductor devices according to embodiments of the present invention will be described below with reference to the accompanying drawings.

Figure 1:
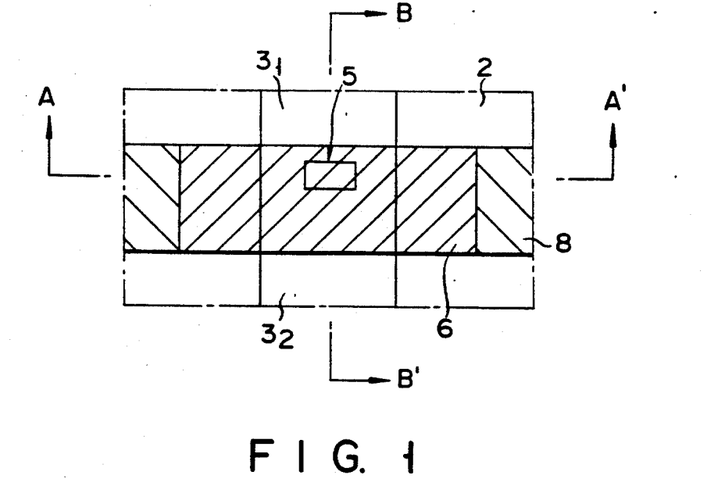
FIG. 1 is a plan view showing a memory cell of a nonvolatile semiconductor memory device according to a first embodiment of the present invention.
Figure 2:
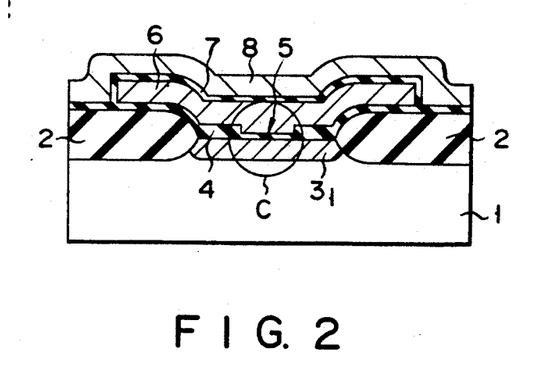
FIG. 2 is a sectional view showing the memory cell taken along a line A—A' in FIG. 1.
Figure 3:
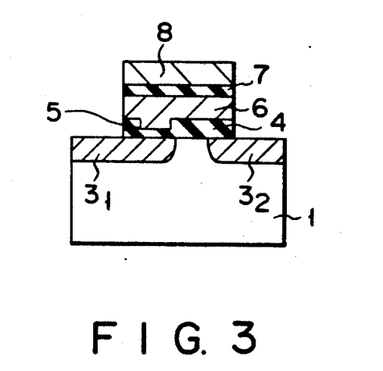
FIG. 3 is a sectional view showing the memory cell taken along a line B—B' in FIG. 1.
Figure 4:
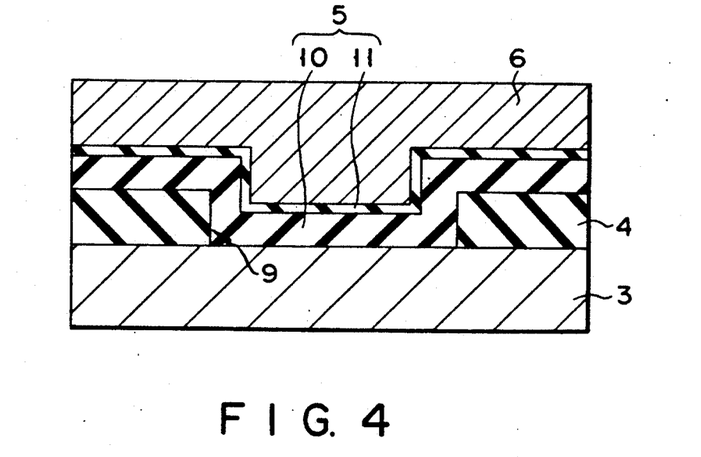
FIG. 4 is an enlarged sectional view showing the memory cell in a circle C in FIG. 2.

FIG. 1 is a plan view showing a memory cell of a nonvolatile semiconductor memory device according to a first embodiment of the present invention, FIG. 2 is a sectional view showing the memory cell taken along a line A—A' in FIG. 1, and FIG. 3 is a sectional view showing the memory cell taken along a line B—B' in FIG. 1. FIG. 4 is an enlarged view showing the memory cell in a circle C in FIG. 2.

As shown in FIGS. 1, 2, and 3, an isolation region 2 is formed in a semiconductor substrate 1 to perform element isolation. Diffused source/drain regions 3 ($3_1$, $3_2$) of a conductivity type opposite to that of the substrate are formed in an element region provided by the element isolation region. A first gate insulating film 4 is provided on the substrate between the diffused layers. A part of the first gate insulating film extends on the source or drain region $3_1$, and a tunnel region 5 is formed in the first gate insulating film. The tunnel region 5 has a tunnel insulating film, through which charges are transferred between a floating gate 6 and the diffused region 3₁. A control gate 8 is provided on the floating gate 6 through a second gate insulating film 7 and is capacitively coupled with the floating gate 6.

The feature of the memory device according to the first embodiment of the present invention is that a tunnel insulating film provided within the tunnel region 5 is constituted by a multilayer film comprised of a silicon nitride film 10 and a silicon oxide film 11.

When the multilayer film is comprised of the silicon nitride film 10 and the silicon oxide film 11, the endurance characteristic can be improved to increase the life of the semiconductor device.

A relationship between the silicon nitride film 10 and the silicon oxide film 11 in the multilayer film will be described below.

As described above, the tunnel insulating film is provided by a single-layer silicon oxide film in conventional structures. In this case, upon FN (FowlerNordheim) tunneling of electrons, the electrons may be trapped in the single-layer silicon oxide film, and this is a factor for deteriorating the endurance characteristic of the tunnel insulating film. It has been known that, in conventional devices, an average electron trapping distance in the silicon oxide film is about 50 Å.

When the thickness of the silicon oxide film is about 50 Å, most of the electrons directly tunnel through the silicon oxide film. Therefore, the number of electrons moving through a conduction band of the silicon oxide film is decreased, and this means that the probability of electron trapping is further decreased.

In order to form a tunnel insulating film by a single-layer silicon oxide film, the silicon oxide film is required to have a thickness of at least 80 Å for obtaining sufficient reliability. This is described in Tech. Dig. IEEE, IEDMP-424 1988.

That is, when the thickness of the silicon oxide film is 80 Å, the probability of electron trapping may be remarkably increased in the remaining region having a thickness of 30 Å obtained by subtracting 50 Å from 80 Å. As a result, the endurance characteristic of the tunnel insulating film may be lowered due to the electron trapping.

Therefore, according to the present invention, the thickness of the silicon oxide film 11 is defined by 50 Å or less, and the electron trapping is theoretically eliminated. Further, the degradation of the reliability of the tunnel insulating film, caused by a decrease in the thickness of the silicon oxide film, is compensated by providing the silicon nitride film 10 on the silicon oxide film.

Electron trapping in the silicon nitride film 10 does not become a decisive factor in the deterioration of the endurance characteristic of the tunnel insulating film for the following reason. Although, like the silicon oxide film 11, the silicon nitride film 10 has a deep level, when an electric field is applied to the silicon nitride film, trapped electrons can escape outside the silicon nitride film.

That is, electrons trapped in the silicon oxide film 11 at the deep level almost cannot be extracted, and they may be stored as fixed charges. However, since electrons trapped at the deep level of the silicon nitride film 10 can be extracted, they may not become fixed charges. Even when the electrons are trapped at the deep level of the silicon nitride film, they may be recombined with holes injected into the film and may disappear.

Thus, electron trapping in the silicon nitride film 10 can be desirable.

For example, a charge retention characteristic, which is a factor of the reliability of EEPROMs, can be improved. That is, since electrons which tend to escape from the floating gate 6 to the substrate 1 (the diffused region 3 in FIGS. 1, 2, and 3) are trapped at the deep level of the silicon nitride film 10, they cannot escape to the substrate 1. Therefore, the charge retention characteristic is further improved.

In data erasing, electrons trapped at the deep level of the silicon nitride film 10 can be removed to the high potential region together with electrons stored in the floating gate 6. Therefore, incomplete erasing may not occur.

The silicon nitride film 11 is also effective as a charge storage portion. Although the charge storage effect is low when compared with the storage amount of the floating gate 6 serving as the main charge storage portion the charge storage effect may be increased as fine pattern technologies are improved.

As described above, the average electron trapping distance in the silicon nitride film is about 35 Å (reference document: P. C. Arnett and B. H. Ynn, Appl. Phys. Lett., vol. 26, pp. 94, 1975).

Therefore, in order to effectively trap electrons, the silicon nitride film must have the thickness at least two times the above average trapping distance, i.e., 70 Å or more (reference document: Eiichi Suzuki "A STUDY ON DEGRADATION MECHANISMS AND LOW VOLTAGE OPERATIONS IN MNOS-TYPE MEMORY DEVICES" disclosed in "RESEARCHERS OF THE ELECTROTECHNICAL LABORATORY" No. 844, May, 1984, P-110).

Thus electron trapping is most effective when the thickness of the silicon oxide film 11 is 50 Å or less and the thickness of the silicon nitride film 10 is 70 Å or more.

Trapping of holes serving as the other carrier will be described below.

When holes are trapped in the tunnel oxide film, the endurance characteristic of the film may be degraded. As a result, the insulating film itself is broken IEDM. 1986. Oxide breakdown dependence on thickness and hole current-enhanced reliability of ultra thin oxides. I. C. Chen et al.)

In a silicon oxide film, an average hole trapping distance is about 10 Å R. C. Hughes and C. H. Seqger, IEEE TRANS. ES-30, No. 6, December 1983).

In order to prevent the hole trapping in the silicon oxide film, theoretically, the thickness of the film must be defined by 10 Å or less.

However, it is very difficult to form a silicon oxide film having the thickness of 10 Å. (For example, a natural oxide film having a thickness of about 20 Å is said to be formed on the surface of silicon in the air.)

Thus, according to the present invention, a silicon oxide film having the minimum thickness, for example, 2 Å which can be obtained by the most advanced technique is used, and the probability of hole trapping is minimized. By the most advanced technique, a silicon oxide film having a thickness of about 50 Å can be properly formed. When the silicon oxide film having the thickness of about 50 Å is used, the number of trapped holes is negligible in practical use.

An average hole trapping distance in a silicon nitride film is relatively large, and is approximately 155 Å. This is because holes are used as a main conduction carrier in the silicon nitride film (reference document: H. E. Maes and R. J. Van. Overstraeten, J. Appl. Phys, vol. 47, P-667 1976).

Therefore, if the silicon nitride film having the thickness of 155 Å or less is used, hole trapping may almost not occur, in theory.

Thus, hole trapping is most effective when the thickness of the silicon oxide film 11 is 50 Å or less and the thickness of the silicon nitride film 10 is 155 Å or less.

In the multilayer tunnel insulating film included in the semiconductor device according to the present invention, is desirable that, the thickness of the silicon oxide film 11 is 50 Å or less, and the thickness of the silicon nitride film 10 is within a range of 70 Å to 115 Å.

When an insulating film is formed of a multilayer structure including at least the silicon nitride film 10 and the silicon oxide film 11, the thickness of the silicon nitride film 10 is set to be larger than that of the silicon oxide film 11.

Therefore, the endurance characteristic of the tunnel insulating film can be further improved.

A method of making the device according to the first embodiment of the present invention will be described for only a characteristic portion with reference to FIGS. 5A to 5C.

Figure 5A:
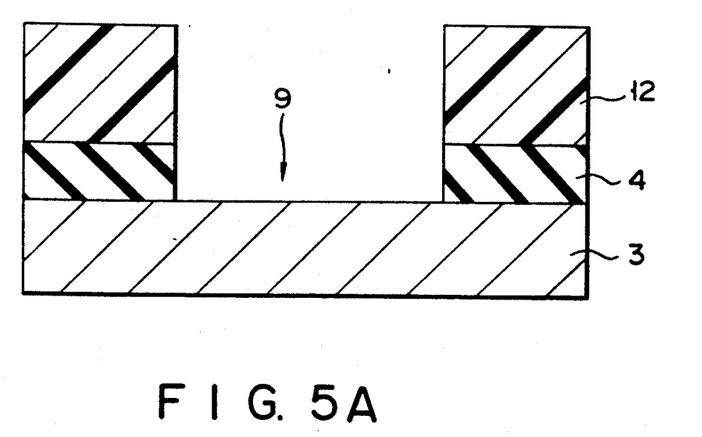
FIGS. 5A to 5C are sectional views showing a method of making a memory cell of the nonvolatile semiconductor memory device according to the first embodiment of the present invention.
Figure 5B:
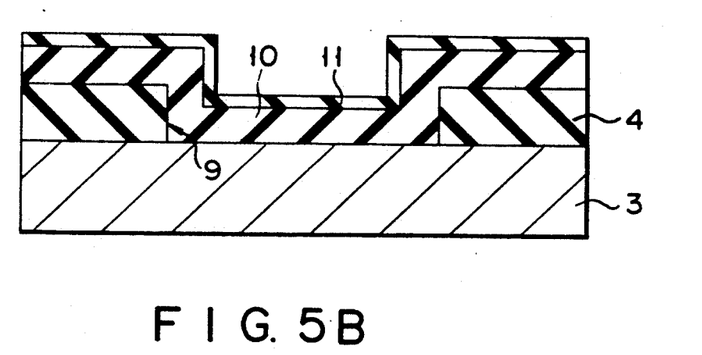
Figure 5C:
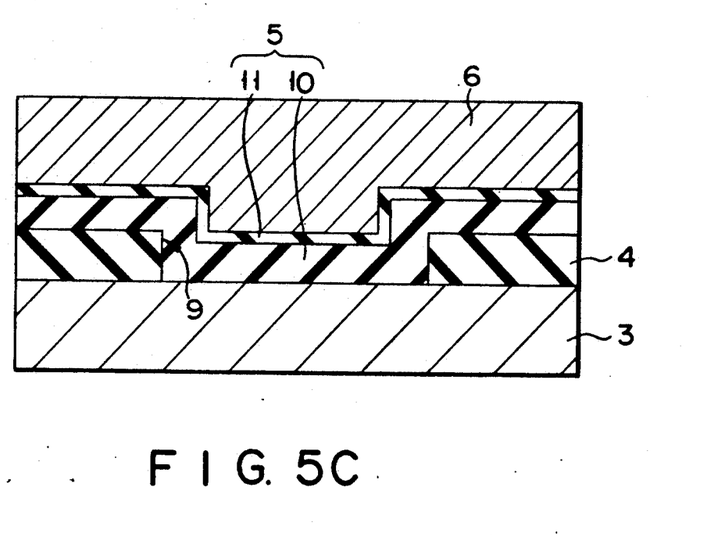

FIGS. 5A to 5C are enlarged views showing a manufacturing process in the circle C of FIG. 2.

As shown in FIG. 5A, a diffused region 3 of one conductivity type opposite to that of a substrate is formed in the substrate (not shown). A first gate oxide film 4 is then formed on the surface of the region by, e.g., thermal oxidation techniques. After the oxide film 4 is coated with a photoresist layer 12, a desired opening pattern for a tunnel region is formed therein by photoetching techniques. The first gate oxide film 4 is selectively removed to provide an aperture 9.

As shown in FIG. 5B, after the photoresist 12 layer is removed, the silicon nitride film 10 is deposited by, e.g., CVD techniques. A thermal oxide film 11 is formed on the surface of the silicon nitride film 10 by, e.g., a hydrogen combustion oxidation technique which is one of thermal oxidation techniques.

In this case, the silicon nitride film 10 may be formed by not only the CVD techniques but also, e.g., thermal nitrogenation techniques such as so-called silicon direct nitrogenation techniques.

As shown in FIG. 5C, a polysilicon layer 6 for a floating gate is deposited by, e.g., CVD techniques.

The semiconductor device may be made according to a conventional EEPROM manufacturing process.

According to the above manufacturing process, an EEPROM can be provided which includes memory cells each having the tunnel insulating film 5 comprised of the silicon nitride film 10 and the silicon oxide film 11.

Second through fourth embodiments will be described below with reference to FIGS. 6 to 8, respectively.

Figure 6:
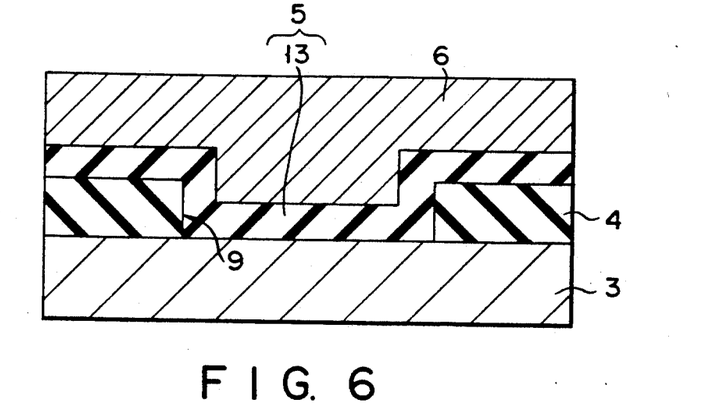
FIG. 6 is a sectional view showing a part of a memory cell of a nonvolatile semiconductor memory device according to a second embodiment of the present invention.
Figure 7:
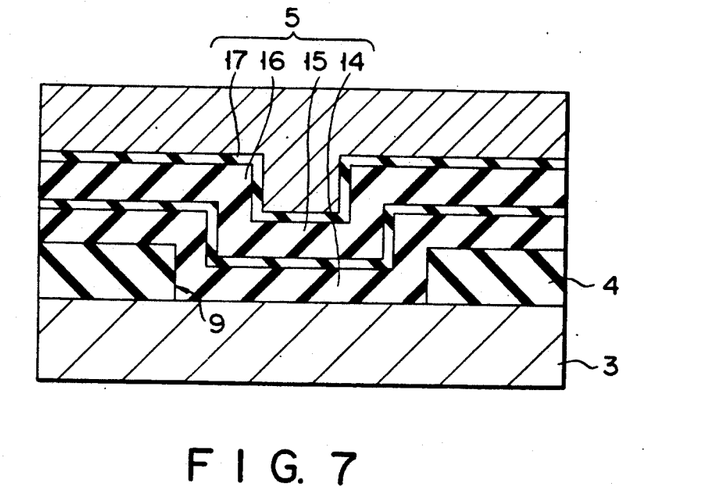
FIG. 7 is a sectional view showing a part of a memory cell of a nonvolatile semiconductor memory device according to a third embodiment of the present invention.
Figure 8:
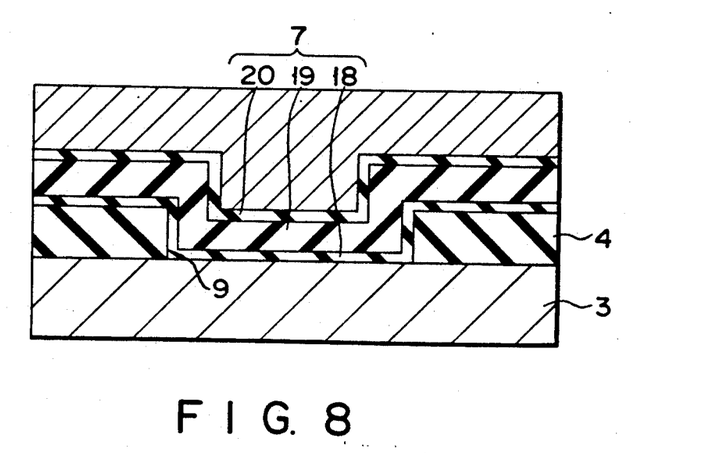
FIG. 8 is a sectional view showing a part of a memory cell of a nonvolatile semiconductor memory device according to a fourth embodiment of the present invention.

Referring to FIGS. 6 to 8, the reference numerals correspond to these in FIGS. 1 to 3, and a description of repeated elements will be omitted. FIGS. 6 to 8 correspond to the enlarged view in the circle C in FIG. 2.

FIG. 6 is an enlarged view showing a tunnel region of a device according to the second embodiment.

A tunnel insulating film formed in the tunnel region 5 is constituted by not only a multilayer structure comprised of a silicon nitride film and a silicon oxide film but also a single layer of only a silicon nitride film 13.

In the above case, like the first embodiment, the endurance characteristic of the tunnel insulating film can be improved to increase the life of the device.

FIG. 7 is an enlarged view showing a tunnel region of a device according to the third embodiment.

A tunnel insulating film formed in the tunnel region 5 is constituted by a four-layer structure comprised of a silicon nitride film 14, a silicon oxide film 15, a silicon nitride film 16, and a silicon oxide film 17.

In this case, the same advantages as in the first embodiment can be obtained.

FIG. 8 is an enlarged view showing a tunnel region of a device according to the fourth embodiment.

A tunnel insulating film formed in a tunnel region 5 is constituted by a three-layer structure formed of a silicon oxide film 18, a silicon nitride film 19, and a silicon oxide film 20.

In this case, the same advantages as in the first embodiment can be obtained.

In the embodiment, the silicon oxide film 18 is formed to be in contact with the substrate (the diffused region 3), and the silicon oxide film 20 is formed to be in contact with a floating gate 6. For this reason, the silicon nitride film 19 is not in contact with the substrate (the diffused region 3 and the silicon layer the floating gate 6. This is the best structure capable of suppressing the formation of surface state at present.

Note that the tunnel insulating film may be provided by a different combination of silicon nitride and oxide films from those used in the first to fourth embodiments.

The devices shown in the second to fourth embodiments can be manufactured by a process to that described in connection with the first embodiment. For example, the device can be made by, e.g., changing an order of formation of the silicon nitride film and the silicon oxide film.

A fifth embodiment of the present invention will be described below with reference to FIGS. 9 to 11.

In this embodiment, an arrangement of a tunnel insulating film according to the present invention is applied to a batch-erasing type EEPROM.

Figure 9:
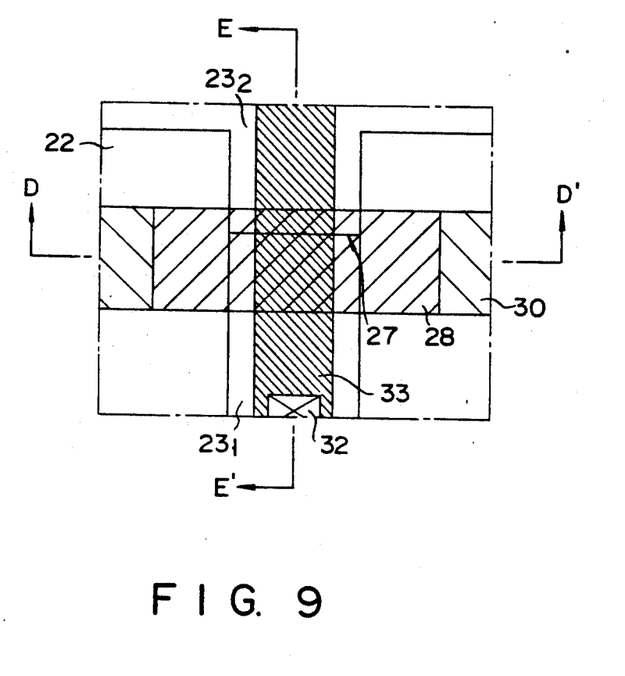
FIG. 9 is a plan view showing a part of a memory cell of a nonvolatile semiconductor memory device according to a fifth embodiment of the present invention.

FIG. 9 is a plan view showing the device according to the fifth embodiment and especially illustrating a memory cell. FIG. 10 is a sectional view showing the device taken along a line D—D' in FIG. 9, and FIG. 11 is a sectional view showing the device taken along a line E—E' in FIG. 9.

Figure 10:
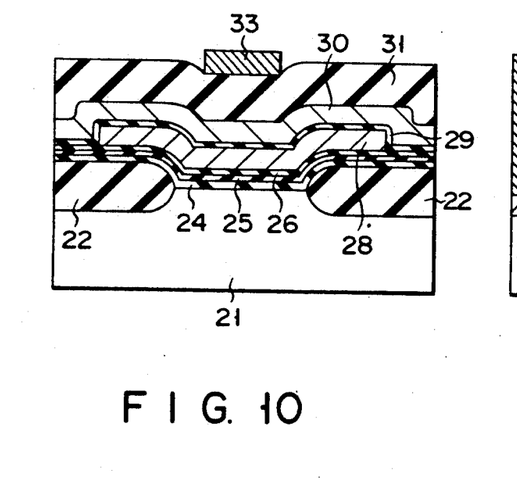
FIG. 10 is a sectional view showing the memory cell taken along a line D—D' in FIG. 9.
Figure 11:
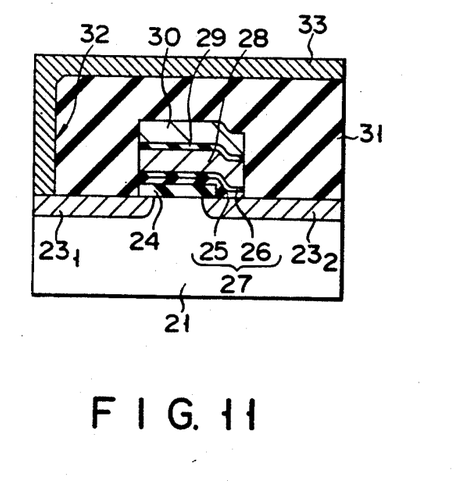
FIG. 11 is a sectional view showing the memory cell taken along a line E—E' in FIG. 9.

As shown in FIGS. 9 to 11, an isolation region 22 is formed in a semiconductor substrate 21 to perform element isolation. Diffused drain/source regions 23 ($23_1$, $23_2$) of a conductivity type opposite to that of the substrate are formed in an element region obtained by the element isolation. A first gate insulating film 24 is provided on the substrate between these regions, and a silicon nitride film 25 and a silicon oxide film 26 are sequentially provided thereon. The multilayer film extends above the source region $23_2$ over the end portion of the first gate insulating film 24. The extended region provides a tunnel region, and the multilayer film serves as a tunnel insulating film 27. Charges are transferred between a floating gate 28 and the substrate 21 or the source region $23_2$ through the tunnel insulating film 27. A control gate 30 is provided above the floating gate 28 through a second gate insulating film 29. An inter-level insulator 31 is provided on the entire surface of the resultant structure to insulate different conductive layers from one other. The inter-level insulator 31 includes a contact hole reaching the drain region $23_1$ so as to provide a bit line 33 therein.

According to the fifth embodiment, and the above-described embodiments, the endurance characteristic of the tunnel insulating film can be improved to increase the life of the device.

In this case, the tunnel region may be provided on the drain region (bit line side) in conjunction with a bias.

In the fifth embodiment, the multilayer film comprised of the silicon nitride film and the silicon oxide film described in the first embodiment is used as the tunnel insulating film. The tunnel insulating film having the structure described in the first to fourth embodiments may be used as the tunnel insulating film 27.

In addition, a tunnel insulating film may be employed which is provided by a different combination of silicon nitride and oxide films from those used i the first to fourth embodiments.

A device according to a sixth embodiment and a method of making the same will be described below with reference to FIG. 12 and FIGS. 13A to 13E.

According to the embodiment, a tunnel insulating film according to the present invention extends to a gate insulating film of a select gate of an EEPROM to increase the breakdown voltage thereof.

Figure 12:
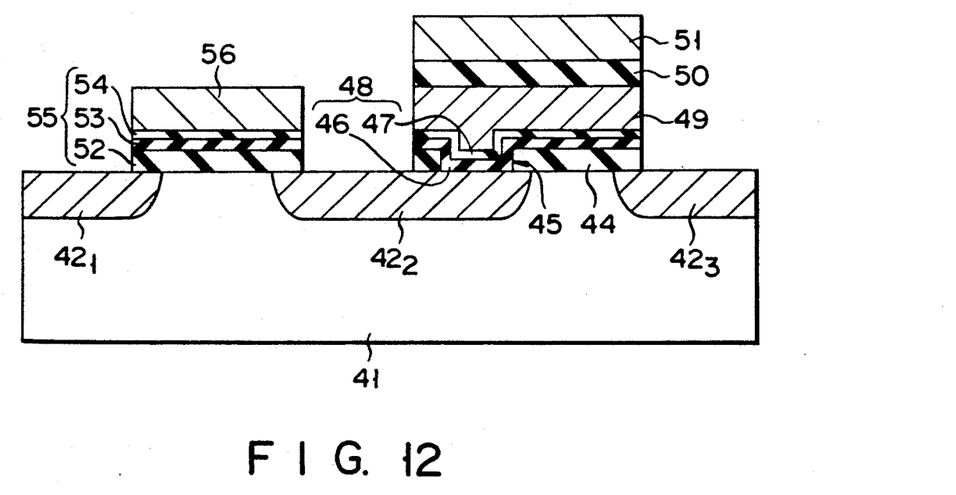
FIG. 12 is a sectional view showing a part of a memory cell of a nonvolatile semiconductor memory device according to a sixth embodiment of the present invention.

FIG. 12 is a sectional view showing a device according to the sixth embodiment and especially illustrating a memory cell.

First, a memory transistor of the memory cell will be described below.

As shown in FIG. 12, an isolation region (not shown) is formed in a semiconductor substrate 41 to perform element isolation. Diffused source/drain regions 42 ($42_1$, $42_2$, $42_3$) of a conductivity type opposite to that of the substrate are provided in an element region obtained by the element isolation. A first gate insulating film 44 is provided on the substrate among the diffused regions $42_1$, $42_2$, and $42_3$. A part of the first gate insulating film extends to the diffused regions $42_2$, and a tunnel region 45 is provided in the first gate insulating film. The tunnel region 45 includes a tunnel insulating film 48 with a multilayer structure, which is comprised of a silicon nitride film 46 and a silicon oxide film 47. Charges are transferred through the tunnel insulating film 48 between a floating gate 49 and the diffused region $42_2$ formed in the substrate 41. A control gate 51 is provided above the floating gate 49 through a second gate insulating film 50.

A structure of a select transistor will be described below.

A gate insulating film 55 with a multilayer structure is provided on the substrate 41 between the diffused regions $42_1$ and $42_2$. The gate insulating film 55 includes an insulating film 52 provided by the first gate insulating film 44, a silicon nitride film 53 and a silicon oxide film 54 both of which are provided by the tunnel insulating film 48. A select gate 56 is provided on the gate insulating film 55.

According to the sixth embodiment, the gate insulating film for the select gate 56 has the multilayer structure which includes the insulating film provided by the tunnel insulating film 48 and the insulating film provided by the first gate insulating film 58. Therefore, since the gate insulating film 55 is used in place of a gate insulating film conventionally provided by only the insulating film 52, an effective electric field can be decreased. In addition, an unwanted fault of the film can be reduced by the multilayer structure using the nitride film.

The above structure is very effective to prevent EEPROMs from unwanted row faults.

A manufacturing method of the device according to the sixth embodiment will be described below with reference to FIGS. 13A to 13E. The same reference numerals in FIGS. 13A to 13E denote the same parts as in FIG. 12.

Figure 13A:
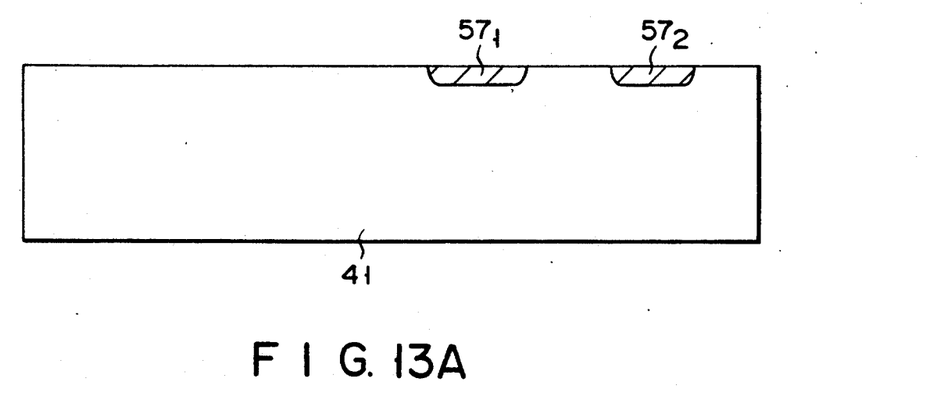
FIGS. 13A to 13E are sectional views showing a method of making the memory cell of the nonvolatile semiconductor memory device according to the sixth embodiment of the present invention.

As shown in FIG. 13A, an impurity of a conductivity type opposite to that of the substrate 41 is ion-implanted into the substrate 41 to provide diffused regions 57 ($57_1$, $57_2$).

Figure 13B:
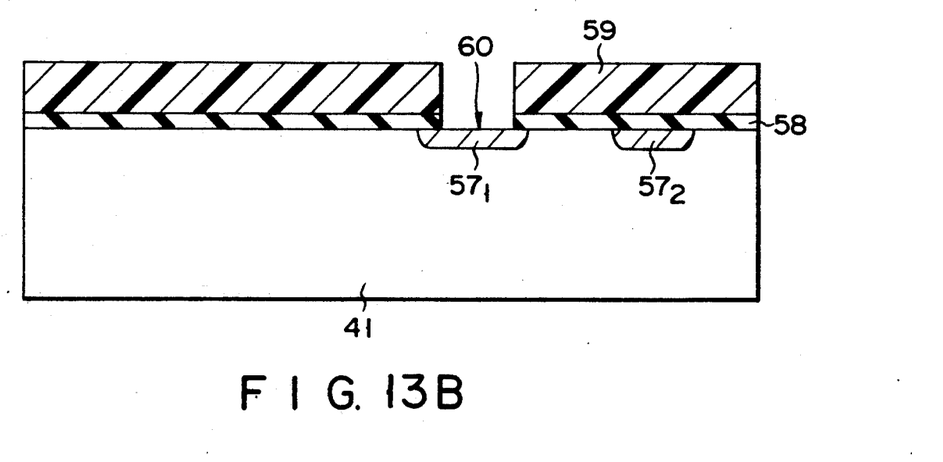

As shown in FIG. 13B, a first thermal oxide film 58 is formed on the surface of the substrate 41 by, e.g., thermal oxidation techniques. After coating the entire surface of the resultant structure with a photoresist layer 59, an opening pattern corresponding to a tunnel region is formed in the photoresist layer by photoetching techniques. This pattern is adjusted to be located on the diffused layer $57_1$. The thermal oxide film 58 is etched using the photoresist layer 59 as a mask thereby forming an aperture 60 therein.

Figure 13C:
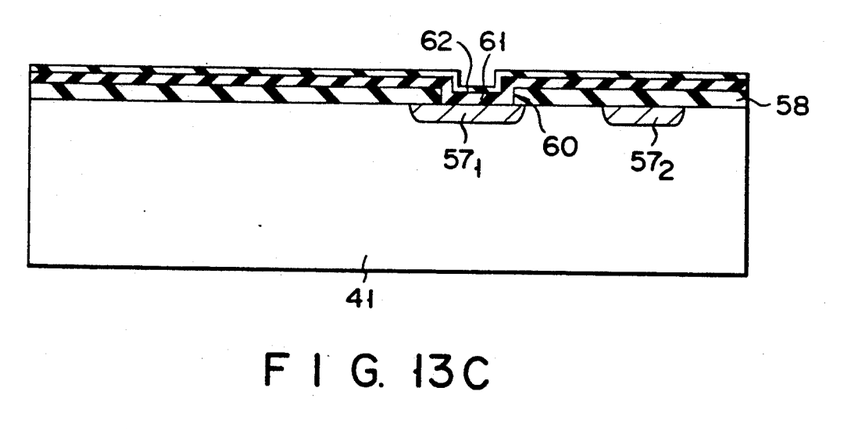

As shown in FIG. 13C, a silicon nitride film 61 is deposited by, e.g., CVD techniques, and a second oxide film 62 is formed on the surface of the silicon nitride film 61 by, e.g., hydrogen combustion oxidation techniques.

Figure 13D:
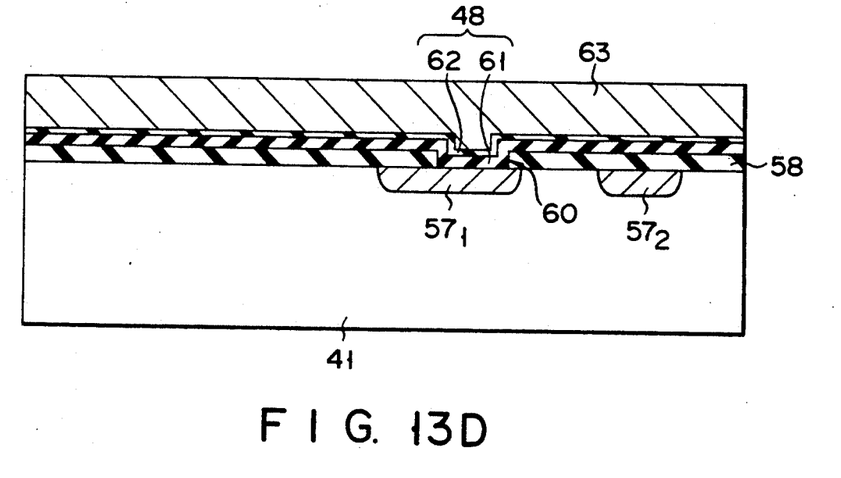

As shown in FIG. 13D, for example, a first polysilicon layer 63 is deposited on the resultant structure by CVD techniques as a conductive layer serving as a floating gate and a select gate.

Figure 13E:
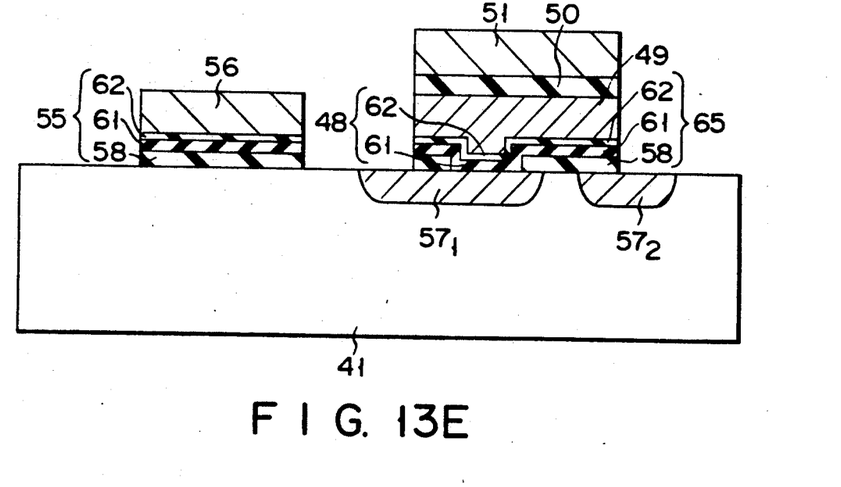

As shown in FIG. 13E, a second gate insulating film 50 is formed by, e.g., thermal oxidation techniques, and a second polysilicon layer is deposited by CVD techniques as a conductive layer serving as a control gate. The second polysilicon layer is patterned to provide the control gate. The second gate insulating film, the first polysilicon layer 63, and the gate insulating film 55 are successively removed by etching, using the patterned polysilicon layer as a mask. Thus, a memory transistor is provided which includes the gate insulating film 65, the floating gate 49, the second gate insulating film 50, and the control gate 51. In this case, the floating gate 49 is formed to overlap at least a part of the diffused regions $57_1$ and $57_2$.

In the select transistor, the gate insulating film 55 with the multilayer structure is almost completed which includes the insulating film 58 for the first gate insulating film, the silicon nitride film 61 and the silicon oxide film 62.

In FIG. 13E, although the second polysilicon layer is removed from the select gate 56, it is not necessarily removed.

Thereafter, although not shown, the device may be made by a usual process for making EEPROMs.

In the manufacturing method described above, in the step of forming the tunnel insulating film having the structure according to the present invention, the first polysilicon layer 63 for the select gate 56 is deposited while the silicon nitride film 61 remains. Therefore, the gate insulating film 55 for the select gate 56 can be formed without increasing the number of manufacturing steps, and its breakdown voltage can be increased.

As a result, the structure described above is very effective to prevent unwanted row faults and remarkably increases the reliability of the EEPROM. In addition, the device can be made without greatly increasing the manufacturing cost.

In the sixth embodiment, although the structure of the tunnel insulating film used in the first embodiment is stacked on the gate insulating film of the floating gate, the structure of the tunnel insulating film described in the second through fourth embodiments may be stacked thereon.

The tunnel insulating film may be provided by a different combination of silicon nitride and oxide films from those used in the first through fourth embodiments.

In EEPROMs according to the first through sixth embodiments, electron trapping and hole trapping, which have become a problem in the single-layer silicon oxide film, used as the tunnel insulating film are improved. For example, in the write/erase cycling that depends upon both the breakdown of the tunnel insulating film and the endurance thereof, the number of writes can be increased by about ten times in 64-Kbit EEPROMs.

This is because the life due to a constant current stress is particularly increased in relation to the breakdown of the tunnel insulating film, and a so-called narrowing effect, i.e., change in the threshold value of the memory transistor, is improved.

In the sixth embodiment, since the insulating film used in the tunnel insulating film, especially the silicon nitride film, is stacked on the gate insulating film of the select gate, the effective electric field of the gate insulating film can be decreased to remarkably reduce row faults in EEPROMs.

According through the first to sixth embodiments, although polysilicon films are used as materials for various gates, silicide films such as molybdenum silicide may be used. Even if the above gate materials are used, the advantages of the present invention can be maintained.

As described above, in the nonvolatile semiconductor memory device according to the present invention, since the silicon nitride film or the multilayer film formed of at least the silicon nitride film and the silicon oxide film is used as the tunnel insulating film, the endurance characteristic can be improved, thereby increasing the life of the nonvolatile semiconductor memory device.

It is further understood by those of ordinary skill in the art that the foregoing discussion describes embodiments of the invention and that various changes and modifications may be made in the invention without departing from the spirit and scope thereof.

What is claimed is:

1. A nonvolatile semiconductor memory device comprising:
   a semiconductor substrate having source and drain regions therein;
   a floating gate provided above said semiconductor substrate through a first gate insulating film;
   a control gate provided above said floating gate through a second gate insulating film; and
   a tunnel region provided in said first gate insulating film, said tunnel region including a tunnel insulating film formed of a silicon nitride film directly in contact with said semiconductor substrate and a silicon oxide film, said silicon nitride film being thicker than said silicon oxide film.

2. The device according to claim 1, wherein said tunnel insulating film has a multilayer structure including at least one silicon nitride film.

3. The device according to claim 2, wherein said multilayer structure includes at least one silicon nitride film and at least one silicon oxide film alternately stacked.

4. The device according to claim 1, wherein a thickness of said silicon nitride film is given by 70 to 155 Å, while a thickness of said silicon oxide film is given by 10 to 70 Å.

5. The device according to claim 3, wherein said silicon nitride film is directly in contact with said semiconductor substrate.

6. The device according to claim 1, wherein a select gate is provided through an insulating film above said semiconductor substrate.

7. The device according to claim 6, wherein said insulating film is comprised of said first gate insulating film and said tunnel insulating film.

* * * * *